(12) United States Patent
Huang

(10) Patent No.: US 7,178,125 B1
(45) Date of Patent: Feb. 13, 2007

(54) METHOD FOR MODELING TRIANGLE MESHED INTERCONNECT STRUCTURES USING AN ELECTRICALLY EQUIVALENT THREE RECTANGLE COMBINATION FOR EACH TRIANGLE IN THE TRIANGLE MESH

(75) Inventor: Ching-Chao Huang, San Jose, CA (US)

(73) Assignee: Optimal Corporation, San Jose, CA (US)

( * ) Notice: Subject to any disclaimer, the term of this patent is extended or adjusted under 35 U.S.C. 154(b) by 329 days.

(21) Appl. No.: 10/885,994

(22) Filed: Jul. 7, 2004

(51) Int. Cl.
*G06F 17/50* (2006.01)

(52) U.S. Cl. ............................ 716/12; 716/13; 716/14; 716/15; 716/16

(58) Field of Classification Search ............. 716/12–16
See application file for complete search history.

(56) References Cited

U.S. PATENT DOCUMENTS

| | | | |
|---|---|---|---|
| 5,319,744 A * | 6/1994 | Kelly et al. ................. 345/647 |
| 5,776,409 A * | 7/1998 | Almquist et al. ........... 264/401 |
| 6,088,254 A | 7/2000 | Kermani ...................... 365/63 |
| 6,260,000 B1 * | 7/2001 | Karasaki et al. ............ 702/155 |
| 6,271,856 B1 * | 8/2001 | Krishnamurthy ............ 345/581 |
| 6,291,324 B1 | 9/2001 | Lescot et al. ............... 438/510 |
| 6,349,272 B1 * | 2/2002 | Phillips ......................... 703/2 |
| 6,480,986 B1 | 11/2002 | Richer ........................... 716/4 |
| 6,665,849 B2 * | 12/2003 | Meuris et al. ................. 716/7 |
| 6,829,757 B1 * | 12/2004 | Teig et al. .................... 716/12 |
| 6,882,460 B2 * | 4/2005 | Tsu et al. .................... 359/279 |
| 6,992,482 B2 * | 1/2006 | Shay et al. .................. 324/235 |
| 2003/0105614 A1 * | 6/2003 | Langemyr et al. ............. 703/2 |
| 2003/0163793 A1 * | 8/2003 | Matsuzawa .................... 716/4 |
| 2005/0160387 A1 * | 7/2005 | Wang ............................ 716/4 |
| 2005/0190179 A1 * | 9/2005 | Hong et al. ................. 345/419 |

OTHER PUBLICATIONS

Pascal Jean Frey and Paul-Louis George, *Mesh Generation: Application to Finite Elements*, Hermes Science Publishing, Oxford, United Kingdom (2000), pp. 116-119.

Albertus J. Kemp, Jacobus A. Pretorius, and Willem Smit, The Generation of a Mesh for Resistance Calculation in Integrated Circuits, *IEEE Transactions on Computer-Aided Design*, vol. 7, No. 10, Oct. 1988, pp. 1029-1037.

(Continued)

*Primary Examiner*—Thuan Do
*Assistant Examiner*—Naum Levin
(74) *Attorney, Agent, or Firm*—Victor H. Okumoto

(57) ABSTRACT

A method for modeling a triangle meshed interconnect structure using an electrically equivalent three rectangle combination for each triangle in the triangle mesh is described. In the method, a surface of an interconnect structure is meshed with triangles. Three rectangles are then defined for each triangle so that each rectangle shares a different side of the triangle. Rectangle circuit models are determined so that the three rectangles are approximately equivalent electrically to the triangle when coupled together. The interconnect circuit model is then formed by connecting together the rectangle circuit models for all triangles defined on the surface of the interconnect structure.

27 Claims, 8 Drawing Sheets

OTHER PUBLICATIONS

Joong-Ho Kim and Madhavan Swaminathan, "Modeling of Irregular Shaped Power Distribution Planes Using Transmission Matrix Method," *IEEE Transactions on Advanced Packaging*, vol. 24, No. 3, Aug. 2001, pp. 334-346.

Joong-Ho Kim and Madhavan Swaminathan, "Modeling of Multilayered Power Distribution Planes Using Transmission Matrix Method," *IEEE Transactions on Advanced Packaging*, vol. 25, No. 2, May 2002 pp. 189-199.

Henry Hungjen Wu, Jeffrey W. Meyer, Keunmyung Lee, and Alan Barber, Accurate Power Supply and Ground Plane Pair Models, *IEEE Transactions on Advanced Packaging*, vol. 22, No. 3, Aug. 1999, pp. 259-266.

J. Eric Bracken, Din-Kow Sun, and Zoltan J. Cendes, "S-Domain Methods for Simultaneous TIme and Frequency Characterization of Electromagnetic Devices," *IEEE Transactions on Microwave Theory and Techniques*, vol. 46, No. 9, Sep. 1998, pp. 1277-1290.

\* cited by examiner

METHOD FOR MODELING TRIANGLE MESHED INTERCONNECT STRUCTURES USING AN ELECTRICALLY EQUIVALENT THREE RECTANGLE COMBINATION FOR EACH TRIANGLE IN THE TRIANGLE MESH

FIELD OF THE INVENTION

The present invention generally relates to the modeling of interconnects in electronic packaging, printed circuit board and integrated circuit structures and in particular, to a method for modeling triangle meshed interconnect structures using an electrically equivalent three rectangle combination for each triangle in the triangle mesh.

BACKGROUND OF THE INVENTION

Accurate simulation of interconnect effects is essential for analyzing impedance mismatch and timing delays in signal propagation, and ground bounce in power distribution systems for high frequency/speed electronic packages, printed circuit boards and integrated circuits.

Meshing is one technique to generate circuit models for irregularly shaped interconnect structures. Using this approach, meshed circuit models are determined and connected together to generate an interconnect circuit model useful for simulation purposes.

Rectangles are commonly used shapes in meshing. Although generating circuit models for rectangles is relatively easy, rectangle meshes may result in stair-cased or Manhattan-like geometries when meshing irregularly shaped interconnect structures, thereby resulting in inaccuracy in generating the interconnect circuit model.

Triangles are also commonly used shapes in meshing. Although triangle meshes may result in improved coverage of an interconnect structure's surface, the determination of triangle model circuits are generally more complicated than those of rectangle meshes.

OBJECTS AND SUMMARY OF THE INVENTION

Accordingly, it is an object of the present invention to provide a method for modeling interconnect structures with the surface coverage of triangle meshing and the computational simplicity of rectangle meshing.

This and other objects are accomplished by the various aspects of the present invention, wherein briefly stated, one aspect is a method for modeling an interconnect structure, comprising: defining a triangle mesh covering a surface of the interconnect structure; defining a rectangle for each side of each triangle in the triangle mesh; and determining effective areas for each of the rectangles such that the three rectangles respectively corresponding to the three sides of each triangle are approximately equivalent electrically to the triangle when coupled together.

Another aspect is a method for modeling an interconnect structure, comprising: defining a triangle mesh covering a surface of an interconnect structure; defining a rectangle for each side of each triangle; and determining a rectangle circuit model for each rectangle so that the rectangle circuit models for the three rectangles defined for each triangle are approximately equivalent electrically to the triangle when coupled together.

Still another aspect is a method for modeling an interconnect structure, comprising: defining a rectangle for each side of each triangle in a triangle mesh defined so as to cover a surface of an interconnect structure; determining a rectangle circuit model for each rectangle so that the rectangle circuit models for the three rectangles defined for each triangle are approximately equivalent electrically to the triangle when coupled together; and connecting the rectangle circuit models together such that the coupled together rectangle circuit models define an interconnect circuit model that is approximately equivalent electrically to the interconnect structure.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
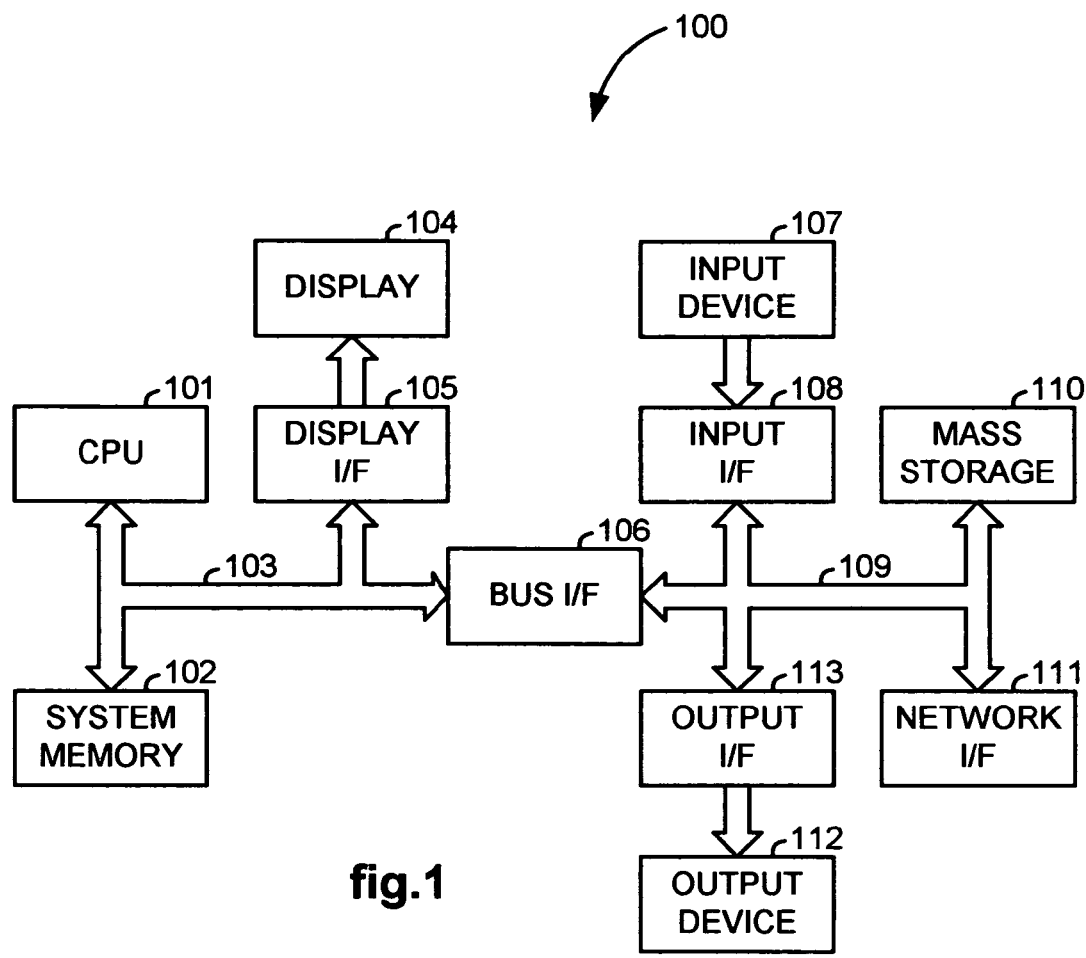
FIG. 1 illustrates a block diagram of a computer system implementing aspects of the present invention.

FIG. 1 illustrates, as an example, a block diagram of a computer system 100 configured to implement the various methods described herein that are applicable to designing an integrated circuit, printed circuit board, integrated circuit package, or other device including interconnects for transmitting electrical signals. Included in the computer system 100 are a central processing unit (CPU) 101 such as those typically employed with personal computers or engineering work stations, system memory 102 such as solid state memory, mass storage 110 such as one or more hard disk drive units, and a number of input and output devices for user interaction with the computer system 100.

Input devices (represented by input device 107) include conventional items such as a keyboard and a user manipulated pointing device such as a mouse. Output devices include a display 104 such as a cathode ray tube (CRT) or liquid crystal display (LCD) display screen, as well as other conventional output devices (represented by output device 112) such as a printer or a plotter. Also preferably included in the computer system 100 is a network interface card 111 for communicating with other computers coupled through a network such as a local area network (LAN) or the Internet.

The computer system 100 also includes cooperative software programs and databases for design verification. In addition to programs to implement the various methods described herein, the computer system 100 includes (or is configured with) software programs such as a 2-D or 3-D field solver, a 3-D geometric model generator that generates a 3-D model of a design from physical and process design data, a mesh generator, a circuit solver, and a S-parameter generator. Databases include such items as a computer-aided design ("CAD") data file storing physical design information, and a technology file storing manufacturing process information.

Figure 2:
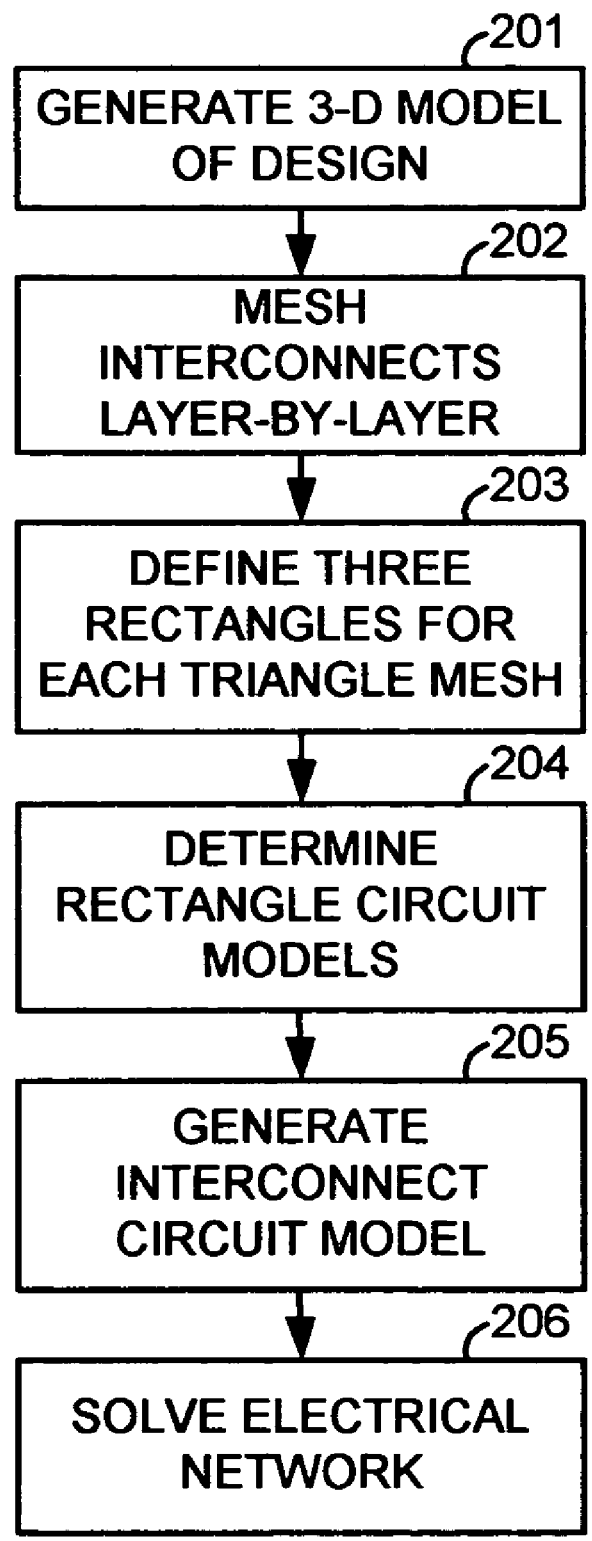
FIG. 2 illustrates a flow diagram of a method for modeling and simulating an interconnect structure, utilizing aspects of the present invention.

FIG. 2 illustrates, as an example, a flow diagram of a method for modeling an interconnect structure. In 201, a 3-D model of a design is generated by the 3-D geometric model generator from CAD data that specifies the layout of the design (such as a GDS-II, MCM, or Gerber file), and a technology file providing process information used in fabricating the design (such as conductivities, dielectric constants, permeability values, and loss tangents).

In 202, each of the interconnect structures is conventionally meshed such as described, for example, in Pascal Jean Frey and Paul-Louis George, *Mesh Generation: Application to Finite Elements*, Hermes Science Publishing, Oxford, United Kingdom, pp. 116–119; or Albertus J. Kemp, Jacobus A. Pretorius, and Willem Smit, "The Generation of a Mesh for Resistance Calculation in Integrated Circuits," *IEEE Transactions on Computer-Aided Design*, Vol. 7, No. 10, October 1988, pp. 1029–1037.

For multi-layered interconnect structures, such meshing is performed on each layer using a layer-by-layer procedure. Vias and contacts are generally treated as "points" so that they are effectively ignored for meshing purposes.

Figure 3:
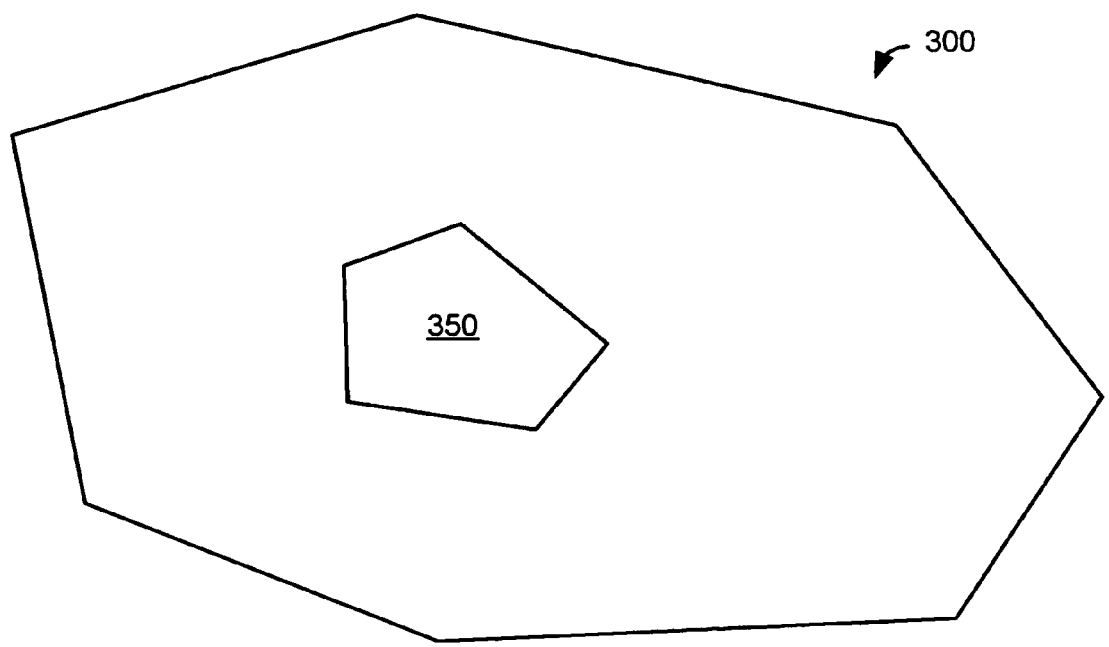
FIGS. 3~4 respectively illustrate a top plan view of an irregularly shaped interconnect structure prior to and after triangle meshing.
Figure 4:
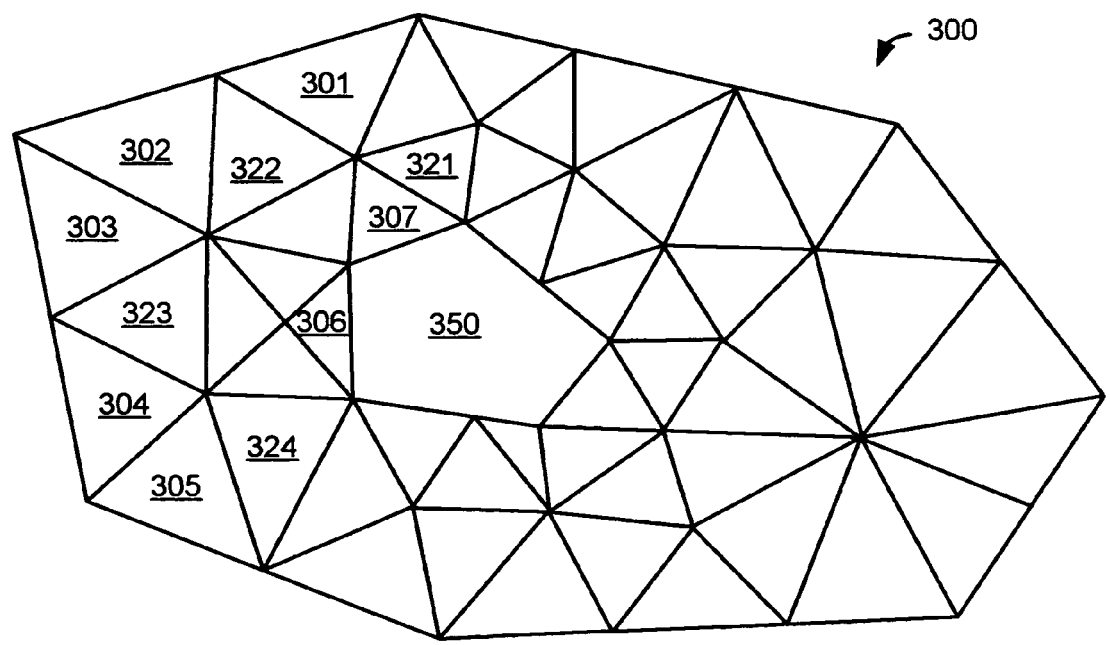

Although meshing may be used on a simple interconnect structure, it is particularly useful when irregularly shaped interconnect structures are to be processed. For example, FIG. 3 illustrates a top plan view of an irregularly shaped interconnect structure 300 that includes a hole 350. The hole 350 is commonly used, for example in printed circuit board and packaging designs, for passing connections between layers above and below the current layer without connecting to the current layer. As shown in FIG. 4, the surface of the irregularly shaped interconnect structure 300 may be meshed with a plurality of triangles so as to completely cover its surface. A triangle mesh is used in this case, rather than square or rectangular meshes, to avoid stair-cased or Manhattan-like structures which may result in inaccuracies and excessive CPU time and memory requirements for processing.

Figure 5:
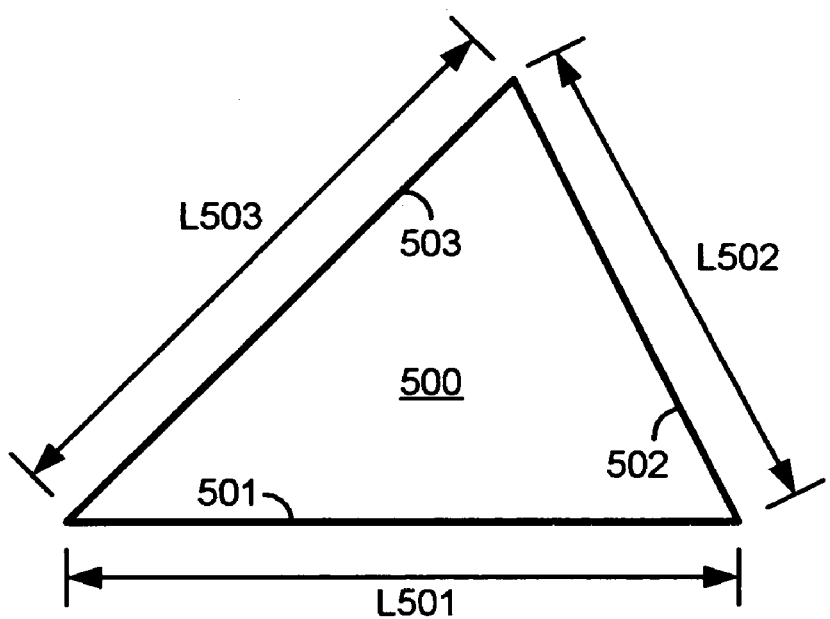
FIG. 5 illustrates a triangle of a triangle mesh.
Figure 6:
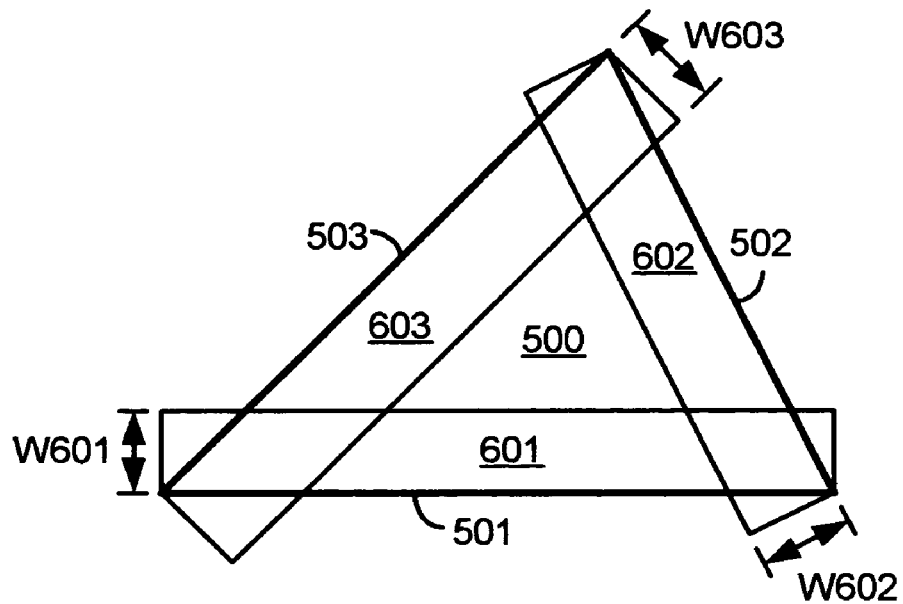
FIG. 6 illustrates three rectangles defined for a triangle, utilizing aspects of the present invention.

After meshing each layer of the interconnect structure, in 203, three rectangles are defined for each triangle, one for each of its sides. For example, FIG. 5 illustrates a representative triangle 500 having sides 501, 502 and 503, and FIG. 6 illustrates three rectangles 601, 602 and 603 positioned so that each rectangle shares one of the sides of the triangle 500. In particular, a first rectangle 601 shares side 501 and has a length L501 and effective width W601, a second rectangle 602 shares side 502 and has a length L502 and effective width W602, and a third rectangle 603 shares side 503 of the triangle 500 and has a length L503 and effective width W603.

In 204, rectangle models are determined for each of the rectangles defined in 203 such that the three rectangles defined for each triangle are approximately equivalent electrically to the triangle when coupled together by determining and using, for example, appropriate values for their respective effective widths. An example of one method for performing this function is described below in reference to FIGS. 7~13. The rectangle models may take the form of either a conventional T or π (pi) or transmission line RLGC circuit model. As an example, FIG. 14 illustrates a simple n-circuit model.

In 205, the rectangle models for all rectangles are then coupled together to generate an interconnect model. One example of such coupling together of T or π RLGC circuit models is described in Joong-Ho Kim and Madhavan Swaminathan, "Modeling of Irregular Shaped Power Distribution Planes Using Transmission Matrix Method," *IEEE Transactions on Advanced Packaging*, Vol. 24, No. 3, August 2001, pp. 334–346; and an example of such coupling together of transmission line RLGC circuit models is described in Henry Hungjen Wu, Jeffrey W. Meyer, Keunmyung Lee, and Alan Barber, "Accurate Power Supply and Ground Plane Pair Models," *IEEE Transactions on Advanced Packaging*, Vol. 22, No. 3, August 1999, pp. 259–266.

For additional accuracy, vertical connections (such as vias, bondwires, solder balls, or solder bumps) in the interconnect structures are identified, and equivalent vertical connection model circuits are determined and coupled to the rectangle circuit models at appropriate connection points. The vertical connection model circuits in this case may have been predetermined through empirical testing of previously fabricated vertical connections or they may be calculated using a field solver.

In 206 the interconnect circuit model is then solved or simulated using SPICE or a circuit solver for their output voltages, currents and/or S-parameters.

Figure 7:
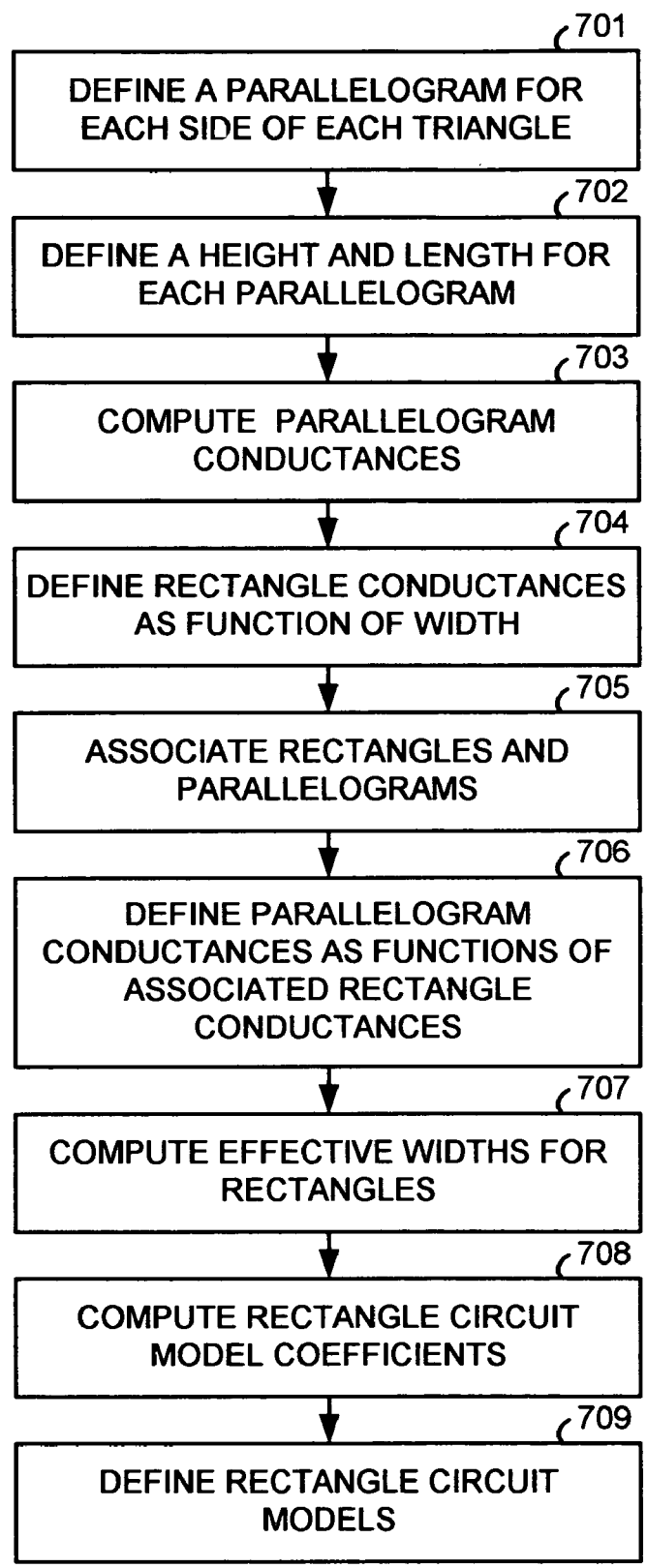
FIG. 7 illustrates a flow diagram of a method for defining rectangle circuit models, utilizing aspects of the present invention.
Figure 8:
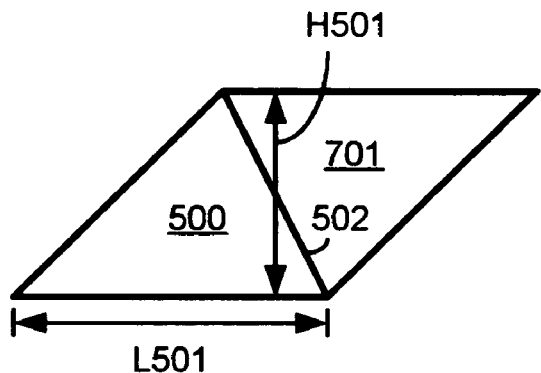
FIGS. 8~10 illustrate parallelograms formed by abutting mirror images of a triangle to different sides of the triangle, utilizing aspects of the present invention.
Figure 9:
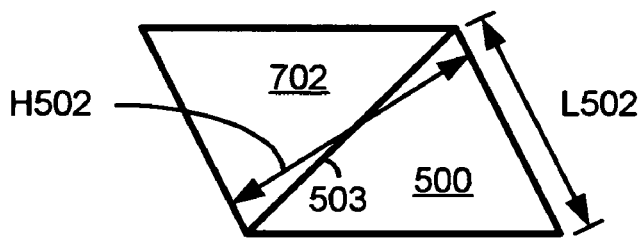
Figure 10:
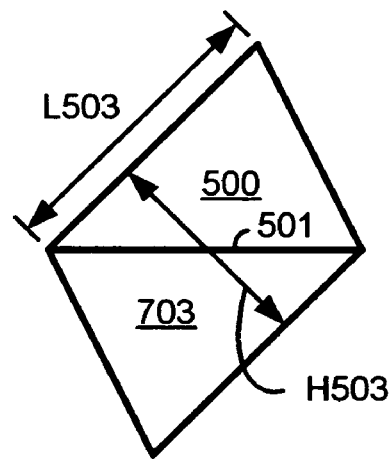

FIG. 7 illustrates, as an example, one method for determining rectangle models for the three rectangles defined for a triangle. In 701, a parallelogram is defined for each side of each triangle. For example, FIG. 8 illustrates a first parallelogram generated by abutting a mirror image 701 of the triangle 500 along its side 502, FIG. 9 illustrates a second parallelogram generated by abutting a mirror image 702 of the triangle 500 along its side 503, and FIG. 10 illustrates a third parallelogram generated by abutting a mirror image 703 of the triangle 500 along its side 501.

In 702, a height and length is defined for each parallelogram. For example, in FIG. 8, the height H501 and length L501 of the first parallelogram are shown. Note that the length L501 in this case is the length of the side 501 of the triangle 500. Similarly, in FIG. 9, the height H502 and length L502 of the second parallelogram are shown, wherein the length L502 is the length of the side 502 of the triangle 500, and in FIG. 10, the height H503 and length L503 of the third parallelogram are shown, wherein the length L503 is the length of the side 503 of the triangle 500.

In 703, the conductance for each of the parallelograms is computed, for example, using the following equations:

$$G_1 = \sigma \times \frac{L501}{H501} \quad (1)$$

$$G_2 = \sigma \times \frac{L502}{H502} \quad (2)$$

$$G_3 = \sigma \times \frac{L503}{H503} \quad (3)$$

where "σ" is the sheet conductivity of the interconnect structure as provided in the technology file, and L501, L502, L503, H501, H502, and H503 are the lengths and heights of the three parallelograms as defined in FIGS. 8~10.

In 704, the conductance for each of the rectangles is defined as a function of their widths, for example, using the following equations:

$$g_a = \sigma \times \frac{W601}{L501} \quad (4)$$

$$g_b = \sigma \times \frac{W602}{L502} \quad (5)$$

$$g_c = \sigma \times \frac{W603}{L503} \quad (6)$$

where "σ" is again the sheet conductivity of the interconnect structure, and L501, L502, L503, W601, W602, and W603 are the lengths and effective widths of the three rectangles as defined in FIG. 6.

Figure 11:
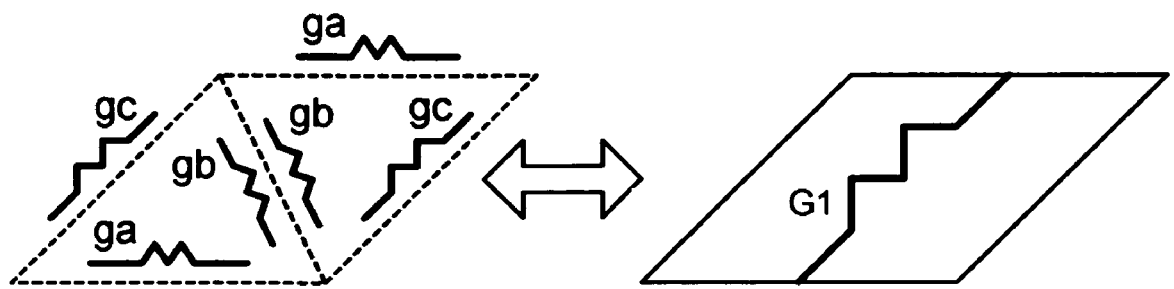
FIGS. 11~13 illustrate the relationship of rectangle and parallelogram conductances for a triangle, utilizing aspects of the present invention.
Figure 12:
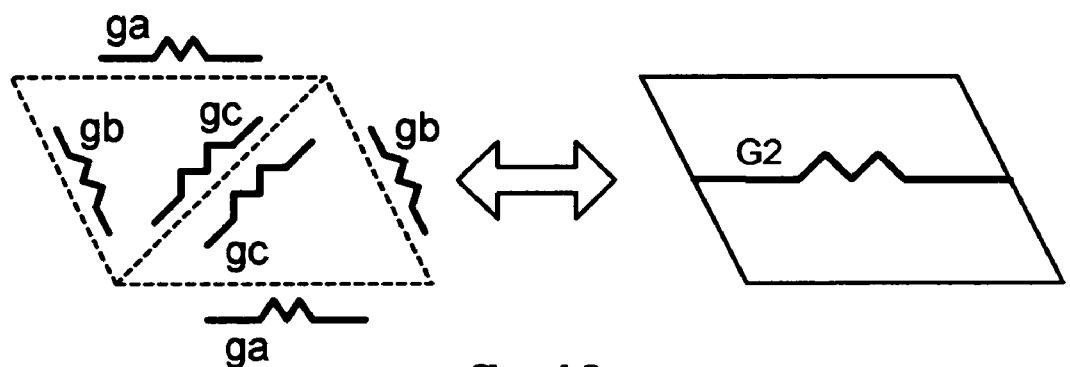
Figure 13:
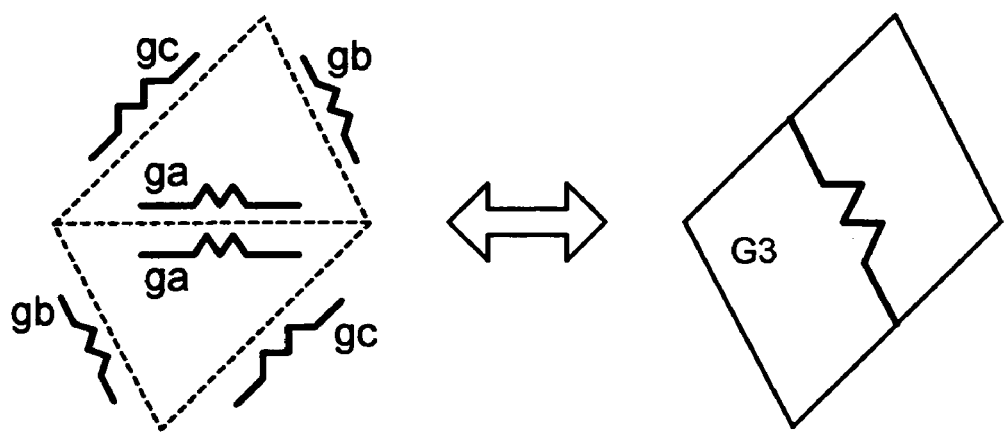
Figure 14:
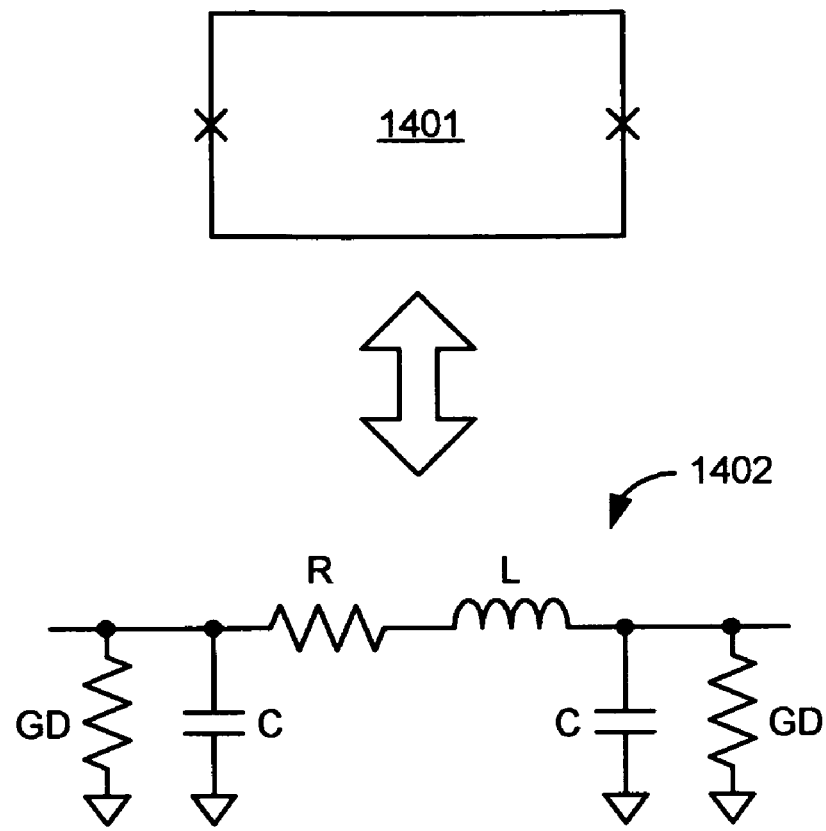
FIG. 14 illustrates a top plan view of a rectangle and its rectangle circuit model.

In 705, the three rectangles and the three parallelograms of the same triangle are associated, and in 706, the parallelogram conductances $G_1$~$G_3$ are defined as functions of their associated rectangle conductances $g_a$~$g_c$, as shown pictorially in FIGS. 11~13 and algebraically by the following equations:

$$G_1 = 2 \times (g_b + g_c) \quad (7)$$

$$G_2 = 2 \times (g_a + g_c) \quad (8)$$

$$G_3 = 2 \times (g_a + g_b) \quad (9)$$

In 707, the effective widths W601, W602 and W603 are computed using the following equations, which were derived from equations (1)~(9):

$$W601 = \frac{L501}{4} \times \left( \frac{L502}{H502} + \frac{L503}{H503} - \frac{L501}{H501} \right) \quad (10)$$

$$W602 = \frac{L502}{4} \times \left( \frac{L501}{H501} + \frac{L503}{H503} - \frac{L502}{H502} \right) \quad (11)$$

$$W603 = \frac{L503}{4} \times \left( \frac{L501}{H501} + \frac{L502}{H502} - \frac{L503}{H503} \right) \quad (12)$$

In 708, rectangle model coefficients are then computed in a conventional fashion using their known lengths L501, L502, L503, determined effective widths W601, W602, W603, and appropriate material property and process values retrieved from the technology file. In 709, the rectangle models are then defined using the computed coefficients as appropriate for the selected form of the rectangle circuit model.

Figure 15:
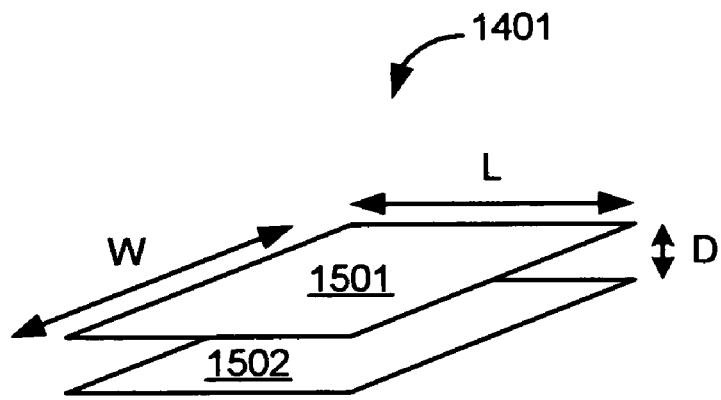
FIG. 15 illustrates a perspective view of parallel plates forming a rectangle.

As one example of 708 and 709, circuit coefficients for the rectangle circuit model 1402 of FIG. 14 can be calculated using the following equations related to its rectangle 1401 illustrated in perspective as two parallel plates 1501 and 1502 in FIG. 15 with dimensions indicated thereon.

$$C = \varepsilon \times \frac{W \times L}{D} \quad (13)$$

$$Li = \mu \times D \times \frac{L}{W} \quad (14)$$

$$R = R_{dc} + R_{ac} \quad (15)$$

$$R_{dc} = 2 \times \frac{1}{\sigma} \times \frac{L}{W} \quad (16)$$

$$R_{ac} = 2 \times \sqrt{\frac{\omega \times \mu}{2 \times \sigma}} \times \frac{L}{W} \quad (17)$$

$$GD = \omega \times C \times \tan(\delta) \quad (18)$$

where "ε" is the dielectric constant of the material between parallel plates 1501 and 1502, "W" is the effective width of the rectangle 1401, "L" is the length of the rectangle 1401, "D" is the distance between the parallel plates 1501 and 1502, "μ" is the permeability of the material between parallel plates 1501 and 1502, "a" is the sheet conductance of the plate 1501, "ω" is the angular frequency in radians per second of an input signal, and "tan(δ)" is the loss tangent of the material between parallel plates 1501 and 1502.

Although the various aspects of the present invention have been described with respect to a preferred embodiment, it will be understood that the invention is entitled to full protection within the full scope of the appended claims. For examples, inductance equations may be used in lieu of the conductance equations in the method described in reference to FIG. 7 to compute effective widths for rectangles, or general quasi-static or full-wave integration formulas may be used in lieu of the method described in reference to FIG. 7 for determining rectangle circuit models for the three rectangles defined for a triangle.

I claim:

1. A method for modeling an interconnect structure, comprising:
    defining a triangle mesh covering a surface of an interconnect structure;
    defining a rectangle for each side of each triangle in the triangle mesh; and
    determining an effective area for each of the rectangles such that the three rectangles respectively corresponding to the three sides of each triangle are approximately equivalent electrically to the triangle when coupled together.

2. The method according to claim 1, wherein the definition of the rectangle for each side of each triangle comprises positioning each rectangle so as to share a different side of the triangle.

3. The method according to claim 1, wherein the determination of the effective area for each of the rectangles comprises determining an effective width for each of the rectangles.

4. The method according to claim 1, further comprising: determining circuit coefficients for a rectangle model circuit for each of the rectangles.

5. The method according to claim 4, wherein the determination of the circuit coefficients for the rectangle model circuit for each of the rectangles comprises:
    defining a parallelogram for each side of each triangle by abutting a mirror image of the triangle along the side;
    associating the rectangles and the parallelograms defined for each triangle;
    computing an equivalent width for each rectangle using electrical relationships between the associated rectangles and parallelograms; and
    computing the circuit coefficients for the rectangle model circuit for each of the rectangles using the equivalent width computed for the rectangle.

6. The method according to claim 5, wherein the electrical relationships are inductance relationships.

7. The method according to claim 5, wherein the electrical relationships are conductance relationships.

8. The method according to claim 7, further comprising:
   determining a height and length for each parallelogram; and
   computing a conductance for each parallelogram using the determined height and length for the parallelogram.

9. The method according to claim 8, wherein the conductance for each parallelogram is computed by dividing the length of each parallelogram by a product generated by multiplying the height of the parallelogram by the conductivity of the interconnect structure.

10. The method according to claim 9, wherein each of the rectangles is characterized by a length and a width, wherein the length of the rectangle is equal to the length of a side of the triangle shared by the rectangle.

11. The method according to claim 10, further comprising defining a conductance for each rectangle as a function of the width of the rectangle.

12. The method according to claim 11, wherein the conductance for each rectangle is defined as being equal to the width of the rectangle divided by a product generated by multiplying the conductivity value for the interconnect structure with the length of the rectangle.

13. The method according to claim 7, further comprising: defining the conductance of each parallelogram of each triangle as a function of conductances of the rectangles defined for the triangle.

14. The method according to claim 13, wherein the conductance for each parallelogram of each of the triangles is defined as being equal to the conductance across opposing sides of the parallelogram.

15. The method according to claim 14, wherein the conductance for each parallelogram of each of the triangles is defined as being equal to twice a sum of the conductances of rectangles defined for the triangle that do not have a side that shares one of the opposing sides of the parallelogram.

16. The method according to claim 4, further comprising:
   defining a rectangle circuit model for each of the rectangles using the circuit coefficients determined for the rectangle circuit model; and
   connecting the rectangle circuit models together such that the coupled together rectangle circuit models define an interconnect circuit model that is approximately equivalent electrically to the interconnect structure.

17. The method according to claim 16, wherein the rectangle circuit model is a T-model circuit.

18. The method according to claim 16, wherein the rectangle circuit model is a pi-model circuit.

19. A method for modeling an interconnect structure, comprising:
   defining a triangle mesh covering a surface of an interconnect structure;
   defining a rectangle for each side of each triangle of the triangle mesh; and
   determining a rectangle circuit model for each rectangle so that the rectangle circuit models for the three rectangles defined for each triangle are approximately equivalent electrically to the triangle when coupled together.

20. The method according to claim 19, wherein the determination of the rectangular circuit model for each rectangle comprises determining coefficients for the rectangle circuit model such that the three rectangles respectively corresponding to the three sides of each triangle are approximately equivalent electrically to the triangle when coupled together.

21. The method according to claim 20, wherein the determination of the coefficients for each of the rectangle circuit models comprises:
   defining a parallelogram for each side of each triangle by abutting a mirror image of the triangle along the side;
   associating the rectangles and the parallelograms defined for each triangle;
   computing an equivalent area for each rectangle using electrical relationships between the associated rectangles and parallelograms; and
   computing the coefficients for each of the rectangle circuit models using the equivalent area computed for the rectangle.

22. The method according to claim 21, wherein the determination of the effective area for each of the rectangles comprises determining an effective width for each of the rectangles.

23. The method according to claim 21, wherein the electrical relationships are inductance relationships.

24. The method according to claim 21, wherein the electrical relationships are conductance relationships.

25. The method according to claim 24, further comprising: defining the conductance of each parallelogram of each triangle as a function of conductances of the rectangles defined for the triangle.

26. The method according to claim 19, further comprising: connecting the rectangle circuit models together such that the coupled together rectangle circuit models define an interconnect circuit model that is approximately equivalent electrically to the interconnect structure.

27. A method for modeling a triangle meshed interconnect structure, comprising:
   defining rectangles for each side of each triangle of a triangle mesh defined on a surface of an interconnect structure;
   determining a rectangle circuit model for each rectangle so that the rectangle circuit models for the three rectangles defined for each triangle are approximately equivalent electrically to the triangle when coupled together; and
   connecting the rectangle circuit models together such that the coupled together rectangle circuit models define an interconnect circuit model that is approximately equivalent electrically to the interconnect structure.

\* \* \* \* \*